United States Patent
Kim

(10) Patent No.: US 10,211,274 B2
(45) Date of Patent: Feb. 19, 2019

(54) ORGANIC LIGHT EMITTING DISPLAY DEVICE

(71) Applicant: Samsung Display Co., Ltd., Yongin-si, Gyeonggi-do (KR)

(72) Inventor: Yang Wan Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 301 days.

(21) Appl. No.: 15/153,152

(22) Filed: May 12, 2016

(65) Prior Publication Data

US 2017/0033173 A1 Feb. 2, 2017

(30) Foreign Application Priority Data

Jul. 31, 2015 (KR) .................. 10-2015-0108604

(51) Int. Cl.
*H01L 27/32* (2006.01)
*G09G 3/3225* (2016.01)
(Continued)

(52) U.S. Cl.
CPC ....... *H01L 27/3276* (2013.01); *G09G 3/3225* (2013.01); *G09G 3/3233* (2013.01); *G09G 3/3275* (2013.01); *H01L 27/3246* (2013.01); *H01L 27/3248* (2013.01); *H01L 27/3258* (2013.01); *H01L 27/3262* (2013.01); *H01L 27/3265* (2013.01); *G09G 2300/0426* (2013.01); *G09G 2300/0439* (2013.01); *G09G 2300/0842* (2013.01); *G09G 2300/0861* (2013.01); *G09G 2310/0297* (2013.01); *G09G 2320/0219* (2013.01); *G09G 2320/0233* (2013.01); *G09G 2330/028* (2013.01); *H01L 27/124* (2013.01); *H01L 27/1248* (2013.01); *H01L 29/78675* (2013.01)

(58) Field of Classification Search
CPC combination set(s) only.
See application file for complete search history.

(56) References Cited

U.S. PATENT DOCUMENTS 8,315,665 B2 11/2012 Kim et al.
8,956,900 B2 2/2015 Kwon et al.
(Continued)

FOREIGN PATENT DOCUMENTS

KR 10-2009-0038670 A 4/2009
KR 10-2010-0043434 A 4/2010
KR 10-2014-0077002 A 6/2014

*Primary Examiner* — Jennifer Mehmood
*Assistant Examiner* — Deeprose Subedi
(74) *Attorney, Agent, or Firm* — Innovation Counsel LLP

(57) ABSTRACT

There is provided an organic light emitting display device. The organic light emitting display device includes a two pixel columns arranged on the substrate to be adjacent to each other, a first data line and a second data line that are provided between the two pixel columns, at least one scan line that intersects the first and second data lines, and first and second insulating layers sequentially laminated on the substrate. Pixels included in the two pixel columns are connected to one of the first data line and the second data line and the scan line. The first data line is formed between the first insulating layer and the second insulating layer. Therefore, coupling generated between adjacent data lines is reduced so that picture quality of the organic light emitting display device is improved.

16 Claims, 7 Drawing Sheets

(51) Int. Cl.
*G09G 3/3275* (2016.01)
*G09G 3/3233* (2016.01)
*H01L 27/12* (2006.01)
*H01L 29/786* (2006.01)

(56) References Cited

U.S. PATENT DOCUMENTS

| | | | |
|---|---|---|---|
| 2011/0175858 A1* | 7/2011 | Lee | G09G 3/3688 345/204 |
| 2013/0235020 A1 | 9/2013 | Kim et al. | |
| 2014/0167009 A1 | 6/2014 | Lee et al. | |
| 2015/0021708 A1* | 1/2015 | Lin | G02F 1/136286 257/390 |
| 2016/0380039 A1* | 12/2016 | Oh | H01L 27/3276 257/40 |

* cited by examiner

ORGANIC LIGHT EMITTING DISPLAY DEVICE

CROSS-REFERENCE TO RELATED APPLICATION

This application claims priority to and the benefit of Korean Patent Application No. 10-2015-0108604, filed on Jul. 31, 2015, in the Korean Intellectual Property Office, the entire contents of which are incorporated herein by reference in their entirety.

BACKGROUND

1. Field

An embodiment of the present inventive concept relates to an organic light emitting display device.

2. Description of the Related Art

Recently, various display devices capable of reducing a weight and a volume that are shortcomings of a cathode ray tube have been developed. The display devices include a liquid crystal display device, a field emission display device, a plasma display panel device, and an organic light emitting display device.

The organic light emitting display device includes pixels that display an image and applies currents to organic light emitting diodes (OLED) included in the pixels to display the image. The pixels emit light components corresponding to data signals supplied through data lines when scan signals are supplied through scan lines.

However, when data lines that supply data signals to different pixels are adjacent to each other, coupling may be generated between the data lines so that the pixels of the organic light emitting display device may not emit light with desired brightness.

SUMMARY

An embodiment of the present inventive concept relates to an organic light emitting display device capable of reducing coupling generated between adjacent data lines and preventing interference of data signals so that pixels emit light components with desired brightness components.

Another embodiment of the present inventive concept relates to an organic light emitting display device capable of reducing coupling generated between data lines and driving transistors in a pixel circuit and preventing interference of data signals so that pixels emit light components with desired brightness components.

An organic light emitting display device according to an embodiment of the present inventive concept includes a substrate, two pixel columns arranged on the substrate to be adjacent to each other, a first data line and a second data line that are provided between the two pixel columns, at least one scan line that intersects the first and second data lines, and first and second insulating layers sequentially laminated on the substrate. Pixels included in the two pixel columns are connected to one of the first data line and the second data line and the scan line. The first data line is formed between the first insulating layer and the second insulating layer.

The organic light emitting display device may further include a driving voltage line provided between the two pixel columns. The driving voltage line may be formed on the first insulating layer.

The organic light emitting display device may further include a driving voltage line provided between the two pixel columns. The driving voltage line may be formed on the second insulating layer.

The organic light emitting display device may further include a data driver and a switching unit. The data driver may receive image data and generate data signals. The switching unit may selectively supply the data signals received from the data driver to one of the first data line and the second data line.

The switching unit may include a demultiplexer circuit.

An organic light emitting display device according to another embodiment of the present inventive concept includes a substrate, two pixel columns arranged on the substrate to be adjacent to each other, a first data line and a second data line that are provided between the two pixel columns, a driving voltage line provided between the two pixel columns, at least one scan line that intersects the first data line, the second data line, and the driving voltage line, and first and second insulating layers sequentially laminated on the substrate. Pixels included in the two pixel columns is connected to one of the first data line and the second data line and the scan line and receives a driving voltage from the driving voltage line. The driving voltage line is formed on the first insulating layer and the first data line is formed on the second insulating layer.

The second data line is formed on the second insulating layer.

The driving voltage line may completely overlap the first data line and the second data line along a traverse direction in a plan view.

The organic light emitting display device further includes a third insulating layer laminated on the second insulating layer. The second data line is formed on the third insulating layer.

At least one driving transistor among pixels included in one of the two pixel columns is formed under the first insulating layer. The driving voltage line overlaps the driving transistor in a plan view. The driving voltage line overlaps the first data line in a plan view.

The driving voltage line overlaps the second data line in a plan view.

According to an embodiment of the present inventive concept, it is possible to provide an organic light emitting display device capable of reducing coupling generated between adjacent data lines and preventing interference of data signals so that pixels emit light components with desired brightness components.

According to another embodiment of the present inventive concept, it is possible to provide an organic light emitting display device capable of reducing coupling generated between data lines and driving transistors in a pixel circuit and preventing interference of data signals so that pixels emit light components with desired brightness components.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one

DETAILED DESCRIPTION

The inventive concept will now be described more fully with reference to the accompanying drawings, in which exemplary embodiments of the inventive concept are shown. The inventive concept may, however, be embodied in many different forms and should not be construed as limited to the exemplary embodiments set forth herein. Rather, these embodiments are provided so that this disclosure will be thorough and complete, and will fully convey the scope of the inventive concept to one of ordinary skill in the art.

It will be understood that, although the terms first and second, etc., may be used herein to describe various elements, these elements should not be limited by these terms. These terms are only used to distinguish one element from another element. For example, a first element may be named a second element and similarly a second element may be named a first element without departing from the scope of the inventive concept.

It will also be understood that when an element is referred to as being "on" another element, it can be directly on the other element, or intervening elements may also be present. On the other hand, when an element is referred to as being "immediately on" or as "directly contacting" another element, it can be understood that intervening elements do not exist. Other expressions describing a relationship between elements, for example, "between" and "directly between" may be interpreted as described above.

Unless otherwise defined, terms such as "include" and "have" are for representing that characteristics, numbers, steps, operations, elements, and parts described in the specification or a combination of the above exist. It may be interpreted that one or more other characteristics, numbers, steps, operations, elements, and parts or a combination of the above may be added.

Unless otherwise defined, all terms (including technical and scientific terms) used herein have the same meaning as commonly understood by one of ordinary skill in the art to which this inventive concept belongs.

Hereinafter, embodiments of the present inventive concept will be described in detail with reference to the accompanying drawings.

Figure 1:
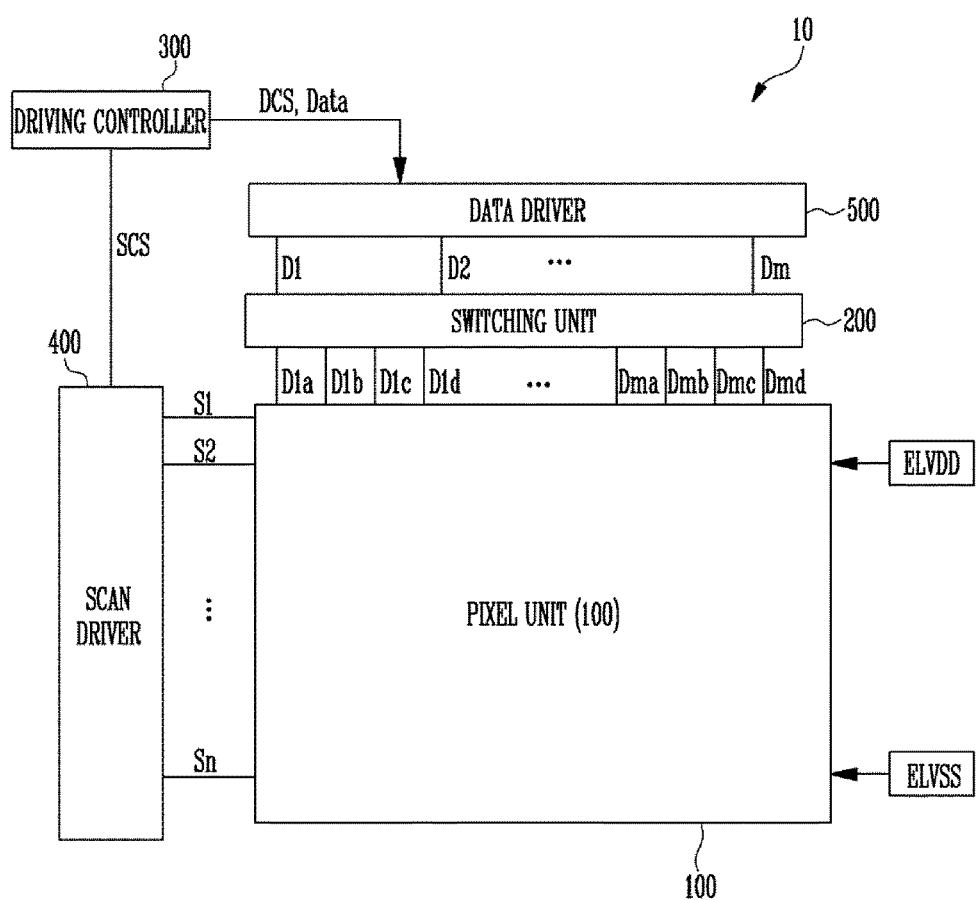
FIG. 1 is a schematic block diagram of an organic light emitting display device according to an embodiment of the present inventive concept.

FIG. 1 is a schematic block diagram of an organic light emitting display device 10 according to an embodiment of the present inventive concept.

Referring to FIG. 1, the organic light emitting display device 10 may include a driving controller 300, a scan driver 400, a data driver 500, a switching unit 200, and a pixel unit 100.

The driving controller 300 may generate a data driving control signal DCS and a scan driving control signal SCS in response to synchronizing signals (for example, a vertical synchronizing signal, a horizontal synchronizing signal, a data enable signal, and an image data signal) supplied from the outside of the organic light emitting display device 10.

The driving controller 300 supplies the data driving control signal DCS to the data driver 500 and may supply the scan driving control signal SCS to the scan driver 400. In addition, the driving controller 300 may supply image data Data supplied from the outside to the data driver 500.

The scan driver 400 may sequentially supply scan signals to scan lines S1 to Sn in accordance with the scan driving control signal SCS supplied from the driving controller 300.

The data driver 500 generates data signals by using the image data Data input from the driving controller 300 and the data driving control signal DCS and may respectively supply the generated data signals to data lines D1 to Dm.

The data driver 500 may be integrated on a substrate on which the pixel unit 100 is formed or may be mounted on the substrate in the form of an IC (integrated circuit) chip.

The switching unit 200 may include a demultiplexer circuit and may transmit the data signals received from the data driver 500 to the pixel unit 100 in accordance with a switching control signal SCS.

The switching unit 200 receives the data signals from the data driver 500 through the data lines D1 to Dm, selects auxiliary data lines D1a to Dmd that supply the data signals in accordance with input control signals, and supplies the data signals to the pixel unit 100 through the selected auxiliary data lines D1a to Dmd. A method of the switching unit 200 selecting the auxiliary data lines D1a to Dmd will be described in detail with reference to FIG. 2.

The pixel unit 100 may include pixels that display a predetermined image and may display the image in accordance with control of the driving controller 300.

For example, when a scan signal is supplied to a scan line (one of S1 to Sn), each of the pixels connected to the selected scan line may receive a data signal from a selected data line (one of D1 to Dm). Each of the pixels that receive the data signals may emit light with brightness corresponding to the data signal.

A power source supplying unit (not shown) is arranged outside the pixel unit 100 and may generate a driving power source to be supplied to the driving controller 300 or each of the pixels of the pixel unit 100.

For example, a power source supplying unit (not shown) may receive a predetermined voltage from a power source such as a battery, may convert the received voltage into a driving voltage ELVDD and a common voltage ELVSS that are required for the pixels, and may apply the driving voltage ELVDD and the common voltage ELVSS to the pixels.

Figure 2:
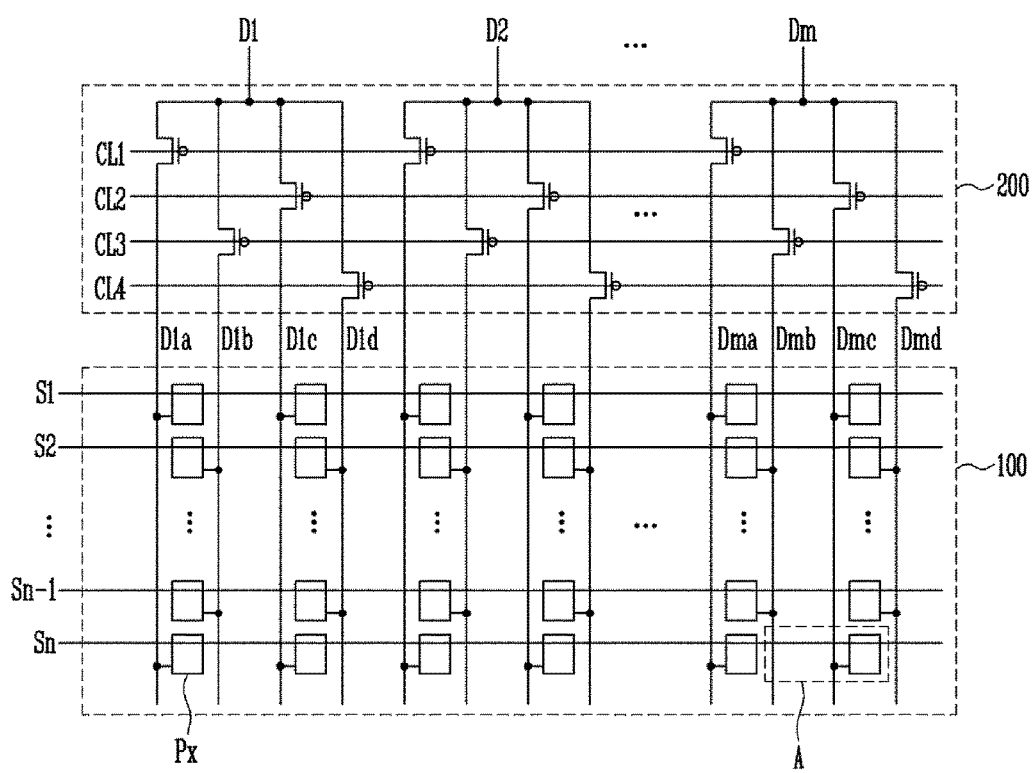
FIG. 2 is a conceptual view of the switching unit and the pixel unit of FIG. 1.

FIG. 2 is a conceptual view of the switching unit and the pixel unit of FIG. 1.

Referring to FIG. 2, the switching unit 200 selects one of the auxiliary data lines D1a to Dmd in accordance with control signals CL1 to CL4 and may supply the data signals supplied from the data lines D1 to Dm to the pixels through the selected auxiliary data lines D1a to Dmd.

The switching unit 200 may include a plurality of transistors which turn on in accordance with inputs of the control signals CL1 to CL4. When the control signals CL1 to CL4 having on levels are input to gate electrodes of transistors of the switching unit, data signals supplied to first electrodes of the transistors having the on levels may be supplied to auxiliary data lines connected to second electrodes of the transistors.

For example, the first control signal CL1, the second control signal CL2, the third control signal CL3, and the fourth control signal CL4 may sequentially maintain the on levels and the transistors that receive the control signals at the on levels may be sequentially turned on.

The pixel unit 100 may include a plurality of pixels Px arranged at intersections of the auxiliary data lines D1a, D1b, D1c, D1d, D2a, D2b, D2c, d2d, . . . , Dma, Dmb, Dmc, and Dmd and the scan lines S1 to Sn. When a scan signal is supplied through a scan line (one of S1 to Sn), each of the pixels Px connected to the scan line may emit light with brightness corresponding to a data signal. A pixel according to the embodiment of the present inventive concept will be described in detail with reference to FIG. 3.

According to the embodiment, pixels arranged in odd rows may be connected to auxiliary data lines arranged on one side of a pixel column and pixels arranged in even rows may be connected to auxiliary data lines arranged on the other side of the pixel column that faces the one side.

In the pixel unit 100 of FIG. 2, pixels adjacent to each other in a column direction may define a pixel column. That is, the pixel column of the organic light emitting display device according to the embodiment of the present inventive concept may refer to pixels alternately connected to two adjacent auxiliary data lines. For example, in the pixel unit 100 of FIG. 2, the pixels connected to the auxiliary data line D1a and the auxiliary data line D1b form one pixel column. The pixels included in the pixel column are arranged in the column direction and are alternately connected to the auxiliary data line D1a on one side of the pixel column and the auxiliary data line D1b. That is, the pixels arranged to be adjacent to each other in the pixel column are not connected to the same auxiliary data line. In the pixel unit 100 of FIG. 2, the pixels connected to the auxiliary data line D1c and the auxiliary data line D1d form one pixel column. Therefore, pixels connected to a data line (one of D1 to Dm) form two pixel columns. For example, in the pixel unit 100 of FIG. 2, pixels connected to the data line D1 are included in one of the pixel column defined by the auxiliary data lines D1a and D1b and the pixel column defined by the auxiliary data lines D1c and D1d.

On the other hand, a detailed layout of the region A of the pixel unit 100 according to an embodiment of the present inventive concept will be described later with reference to FIGS. 4 and 6.

Figure 3:
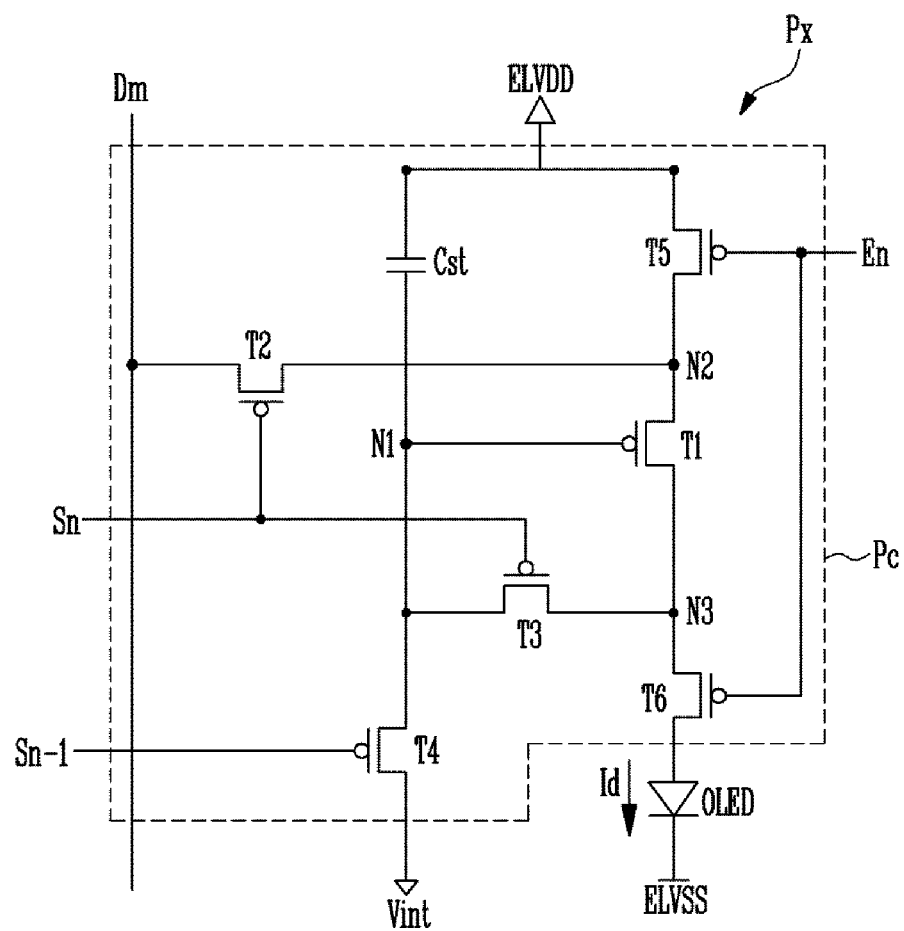
FIG. 3 is a circuit diagram of a pixel according to an embodiment of the present inventive concept.

FIG. 3 is a circuit diagram of a pixel Px according to an embodiment of the present inventive concept.

Referring to FIG. 3, the pixel Px may include an OLED that emits light and a pixel circuit Pc that supplies a driving current to the OLED.

The pixel circuit Pc may include a plurality of signal lines and a driving thin film transistor (TFT) T1, a switching TFT T2, a compensating TFT T3, an initializing TFT T4, an operation control TFT T5, and an emission control TFT T6 as TFTs.

In addition, the pixel circuit Pc may include a storage capacitor Cst.

The scan line Sn is connected to gate electrodes of the switching TFT T2 and the compensating TFT T3 and supplies a scan signal. The previous scan line Sn−1 is connected to a gate electrode of the initializing TFT T4 and supplies a previous scan signal to the initializing TFT T4. An emission control line En is connected to gate electrodes of the operation control TFT T5 and the emission control TFT T6 and supplies an emission control signal.

The data line Dm is connected to a first electrode of the switching TFT T2 and supplies the data signal.

A driving voltage line is connected to a first electrode of the operation control TFT T5 and a first electrode of the storage capacitor Cst and transmits the driving voltage ELVDD. An initializing voltage line is connected to a second electrode of the initializing TFT T4 in order to transmit an initializing voltage Vint that initializes the driving TFT T1.

Hereinafter, a connection relationship between the plurality of TFTs T1 to T6 and the storage capacitor Cst will be described in detail.

The gate electrode of the driving TFT T1 is connected to a second electrode of the storage capacitor Cst, the first electrode thereof is connected to a second node N2, and the second electrode thereof is connected to a third node N3.

The driving TFT T1 receives the data signal in accordance with a switching operation of the switching TFT T2 and may supply a driving current Id to the OLED.

The gate electrode of the switching TFT T2 is connected to the scan line Sn, the first electrode thereof is connected to the data line Dm, and the second electrode thereof is connected to the second node N2. The switching TFT T2 is turned on in accordance with the scan signal received through the scan line Sn and may perform the switching operation of supplying the data signal transmitted to the data line Dm to the second electrode of the driving TFT T1.

The gate electrode of the compensating TFT T3 is connected to the scan line Sn, the first electrode thereof is connected to the first node N1, and the second electrode thereof is connected to the third node N3. The compensating TFT T3 is turned on in accordance with the scan signal received through the scan line Sn and may connect the gate electrode and the second electrode of the driving TFT T1 so that the driving TFT T1 may be diode-connected.

The gate electrode of the initializing TFT T4 is connected to the previous scan line Sn−1, the first electrode thereof is connected to the first node N1, and the second electrode thereof is connected to the initializing voltage line. The initializing TFT T4 is turned on in accordance with the previous scan signal received through the previous scan line Sn−1 and may transmit the initializing voltage Vint to the gate electrode of the driving TFT T1 so that the initializing TFT T4 may perform an initializing operation of initializing a voltage of the gate electrode G1 of the driving TFT T1.

The gate electrode of the operation control TFT T5 is connected to the emission control line En, the first electrode thereof is connected to the driving voltage line, and the second electrode thereof is connected to the second node N2.

The gate electrode of the emission control TFT T6 is connected to the emission control line En, the first electrode thereof is connected to the third node N3, and the second electrode thereof is electrically connected to an anode of the OLED. The operation control TFT T5 and the emission control TFT T6 are simultaneously turned on in accordance with the emission control signal transmitted through the emission control line En and supply the driving voltage ELVDD to the OLED so that the driving current Id flows to the OLED.

The first electrode of the storage capacitor Cst is connected to the driving voltage line and the second electrode thereof is connected to the first node N1.

The anode of the OLED is connected to the second electrode of the emission control TFT T6 and a cathode thereof is connected to the common voltage ELVSS. The OLED receives the driving current Id from the driving TFT T1 and emits light so that an image may be displayed.

Figure 4:
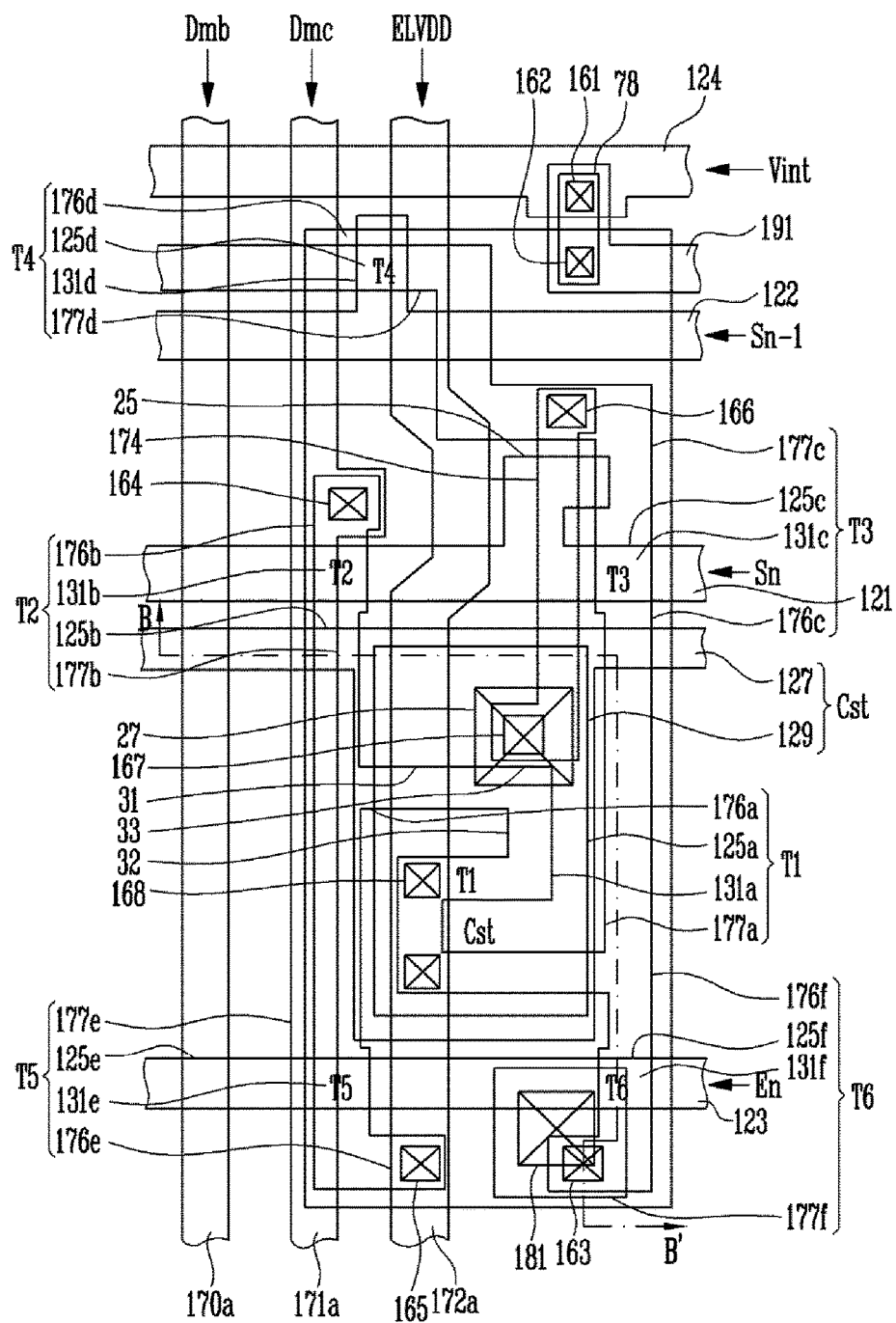
FIG. 4 is a detailed layout diagram of the region A of FIG. 2 according to an embodiment of the present inventive concept.
Figure 5A:
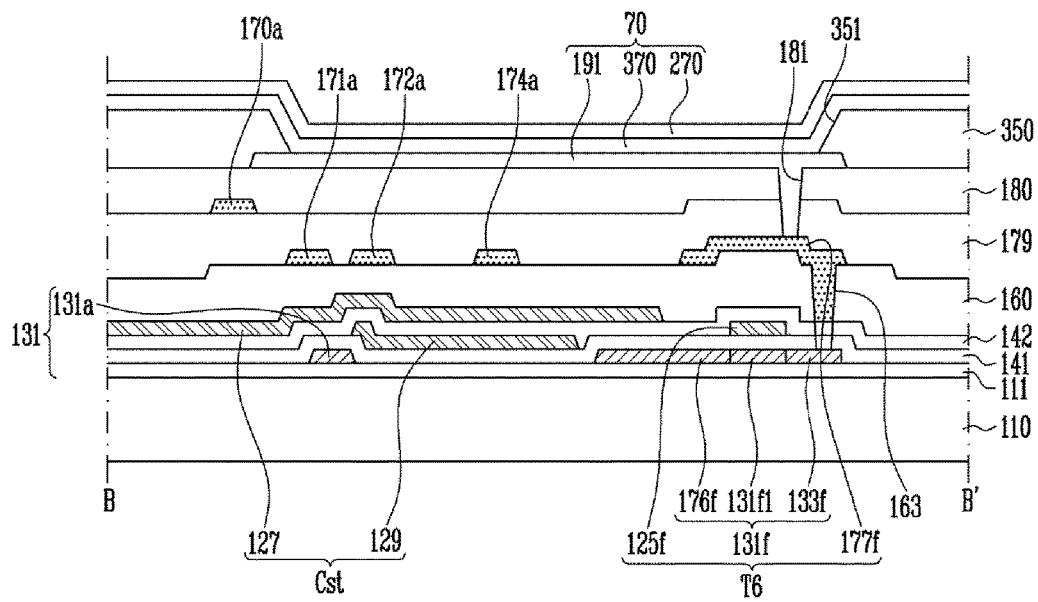
FIG. 5A is a cross-sectional view taken along the line B-B' of the layout of FIG. 4 according to an embodiment of the present inventive concept.

FIG. 4 is a detailed layout diagram of the region A of FIG. 2 according to an embodiment of the present inventive concept. FIG. 5A is a cross-sectional view taken along the line B-B' of the layout of FIG. 4 according to an embodiment of the present inventive concept.

Referring to FIGS. 4 and 5A, the pixel of the organic light emitting display device according to the embodiment of the present inventive concept may be connected to a first data line 170a, a second data line 171a, and a driving voltage line 172a that are arranged in a first direction (a column direction). In addition, the pixel may be connected to a scan line 121, a previous scan line 122, an emission control line 123, and an initializing voltage line 124 that intersect the first data line 170a and may receive the scan signal, the previous scan signal, the emission control signal, and the initializing voltage Vint, respectively. Referring to FIGS. 2 and 4, the first data line 170a of FIG. 4 corresponding to the data line Dmb of FIG. 2 supplies data to at least one pixel in a pixel column on the left. In addition, the second data line 171a of FIG. 4 corresponding to the data line Dmc of FIG. 2 supplies data to at least one pixel in a pixel column on the right as disclosed in the layout of FIG. 4.

The driving TFT T1, the switching TFT T2, the compensating TFT T3, the initializing TFT T4, the operation control TFT T5, the emission control TFT T6, the storage capacitor Cst, and the OLED may be arranged in the pixel.

The driving TFT T1, the switching TFT T2, the compensating TFT T3, the initializing TFT T4, the operation control TFT T5, and the emission control TFT T6 may be arranged may have a semiconductor layer 131 which includes 131a, 131b, 131c, 131d, 131e and 131f, respectively.

The semiconductor layer 131 is formed of polysilicon and includes a channel region that is not doped with impurities and a source region and a drain region formed by doping impurities on both sides of the channel region. Here, the impurities may vary in accordance with a type of the transistors and n-type impurities or p-type impurities may be doped in the source region and the drain region.

The semiconductor layer 131 may include a first semiconductor layer 131a formed in the driving TFT T1, a second semiconductor layer 131b formed in the switching TFT T2, a third semiconductor layer 131c formed in the compensating TFT T3, a fourth semiconductor layer 131d formed in the initializing TFT T4, a fifth semiconductor layer 131e formed in the operation control TFT T5, and a sixth semiconductor layer 131f formed in the emission control TFT T6.

The driving TFT T1 may include the first semiconductor layer 131a, a driving gate electrode 125a, a driving source electrode 176a, and a driving drain electrode 177a. A driving source region doped with impurities in the driving semiconductor layer 131a is referred to as the driving source electrode 176a. A driving drain region doped with impurities in the driving semiconductor layer 131a is referred to as the driving drain electrode 177a.

The storage capacitor Cst may be formed on the driving gate electrode 125a to overlap the driving gate electrode 125a in a plan view.

The storage capacitor Cst may include a first storage condenser plate 129 and a second storage condenser plate 127 that are arranged with a second gate insulating layer 142 interposed.

Here, the second gate insulating layer 142 is a dielectric material and storage capacitance is determined by a voltage between the first storage condenser plate 129 and the second storage condenser plate 127 and charge accumulated in the storage capacitor Cst.

According to the embodiment, the storage capacitor Cst may be formed by overlapping a part of the second storage condenser plate 127 and the first storage condenser plate 129. In addition, the driving gate electrode 125a may function as the first storage condenser plate 129.

The switching TFT T2 may include the switching semiconductor layer 131b, the switching gate electrode 125b, the switching source electrode 176b, and a switching drain electrode 177b. The switching source electrode 176b protrudes from the second data line 171a. The switching drain electrode 177b may be a switching drain region doped with impurities in the switching semiconductor layer 131b.

The compensating TFT T3 may include the compensating semiconductor layer 131c, the compensating gate electrode 125c, the compensating source electrode 176c, and the compensating drain electrode 177c. The compensating source electrode 176c is a compensating source region doped with impurities in the compensating semiconductor layer 131c. The compensating drain electrode 177c may be a compensating drain region doped with impurities in the compensating semiconductor layer 131c.

The initializing TFT T4 may include the initializing semiconductor layer 131d, an initializing gate electrode 125d, an initializing source electrode 176d, and an initializing drain electrode 177d. The initializing drain electrode 177d may be an initializing drain region doped with impurities in the initializing semiconductor layer 131d.

The initializing source electrode 176d may be connected to the initializing voltage line 124 through an initializing connection line 78. One end of the initializing connection line 78 is connected to the initializing voltage line 124 through a contact hole 161 formed in the second gate insulating layer 142 and a first interlayer insulating layer 160. The other end of the initializing connection line 78 may be connected to the initializing source electrode 176d through the contact hole 162 formed in a gate insulating layer 141, the second gate insulating layer 142, and the first interlayer insulating layer 160.

The operation control TFT T5 may include the operation control semiconductor layer 131e, the operation control gate electrode 125e, an operation control source electrode 176e, and an operation control drain electrode 177e. The operation control source electrode 176e is a part of the driving voltage line 172a. The operation control drain electrode 177e may be an operation control drain region doped with impurities in the operation control semiconductor layer 131e.

The emission control TFT T6 may include the emission control semiconductor layer 131f, the emission control gate electrode 125f, an emission control source electrode 176f, and an emission control drain electrode 177f The emission control source electrode 176f may be an emission control source region doped with impurities in the emission control semiconductor layer 131f.

One end of the driving semiconductor layer 131a of the driving TFT T1 may be connected to the switching semiconductor layer 131b and the operation control semiconductor layer 131e and the other end of the driving semiconductor layer 131a of the driving TFT T1 may be connected to the compensating control semiconductor layer 131c and the emission control semiconductor layer 131f.

Therefore, the driving source electrode 176a is connected to the switching drain electrode 177b and the operation control drain electrode 177e and the driving drain electrode 177a may be connected to the compensating source electrode 176c and the emission control source electrode 176f.

The first storage condenser plate 129 of the storage capacitor Cst may be connected to the compensating drain electrode 177c and the initializing drain electrode 177d through a connection member 174.

On the other hand, the switching TFT T2 may be used as a switching element that selects a pixel desired to emit light. The switching gate electrode 125b is connected to the scan line 121, the switching source electrode 176b is connected to the second data line 171b, and the switching drain electrode 177b may be connected to the driving TFT T1 and the operation control TFT T5. In the organic light emitting display device according to the embodiment of the present inventive concept, a second interlayer insulating layer 179 is formed on the first interlayer insulating layer 160 and a protective layer 180 is formed on the second interlayer insulating layer 179.

The emission control drain electrode 177f of the emission control TFT T6 may be directly connected to a pixel electrode 191 of an OLED 70 through a contact hole 181 formed in a protective layer 180.

Referring to FIGS. 4 and 5A, the first data line 170a and the second data line 171a which are adjacent each other and arranged between two pixel columns of the pixel unit in the organic light emitting display device according to the embodiment of the present inventive concept are formed on different layers. That is, the first data line 170a is formed on the second interlayer insulating layer 179 and the second data line 171a is formed on the first interlayer insulating layer 160. Therefore, in the organic light emitting display device according to the embodiment of the present inventive concept, since the first data line 170a and the second data line 171a arranged between the two adjacent pixel columns are formed on different layers, influence by coupling between the first data line 170a and the second data line 171a may be reduced. That is, according to the embodiment of the present inventive concept, when the first data line 170a and the second data line 171a are formed on different layers, although a distance between the first data line 170a and the second data line 171a in a plan view is reduced in a plan view, influence by coupling between data lines may be minimized. Therefore, it is advantageous to implementing high resolution.

Figure 5B:
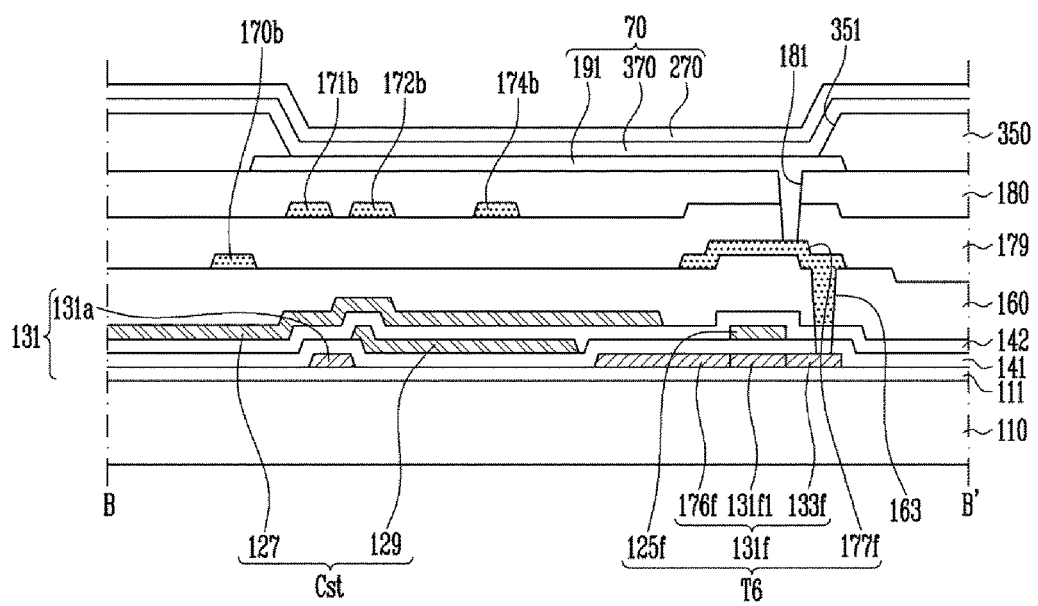
FIG. 5B is a cross-sectional view taken along the line B-B' of the layout of FIG. 4 according to another embodiment of the present inventive concept.

FIG. 5B is a cross-sectional view taken along the line B-B' of the layout of FIG. 4 according to another embodiment of the present inventive concept.

FIG. 5B is different from FIG. 5A only in positions of a first data line 170b, the second data line 171b, a driving voltage line 172b, and a connection member 174b. In FIG. 5A, the second data line 171a, the driving voltage line 172a, and the connection member 174a are formed on the first interlayer insulating layer 160 and the first data line 170a is formed on the second interlayer insulating layer 179. On the other hand, in FIG. 5B, the first data line 170b is formed on the first interlayer insulating layer 160 and the second data line 171b, the driving voltage line 172b, and the connection member 174b are formed on the second interlayer insulating layer 179. That is, in FIG. 5A, the first data line 170a is formed in an upper layer than a layer in which the second data line 171a is formed. However, in FIG. 5B, the first data line 170b is formed in a lower layer than a layer in which the second data line 171b is formed. Therefore, according to another embodiment of the present inventive concept of FIG. 5B, since the first data line 170b and the second data line 171b positioned between two adjacent pixel columns are formed on different layers, influence by coupling between the first data line 170b and the second data line 171b may be reduced. That is, according to the embodiment of the present inventive concept, when the first data line 170b and the second data line 171b are formed on different layers, although a distance in a plan view between the first data line 170b and the second data line 171b is reduced on a plane, influence by coupling between data lines may be minimized. Therefore, it is advantageous to implementing high resolution.

Figure 6:
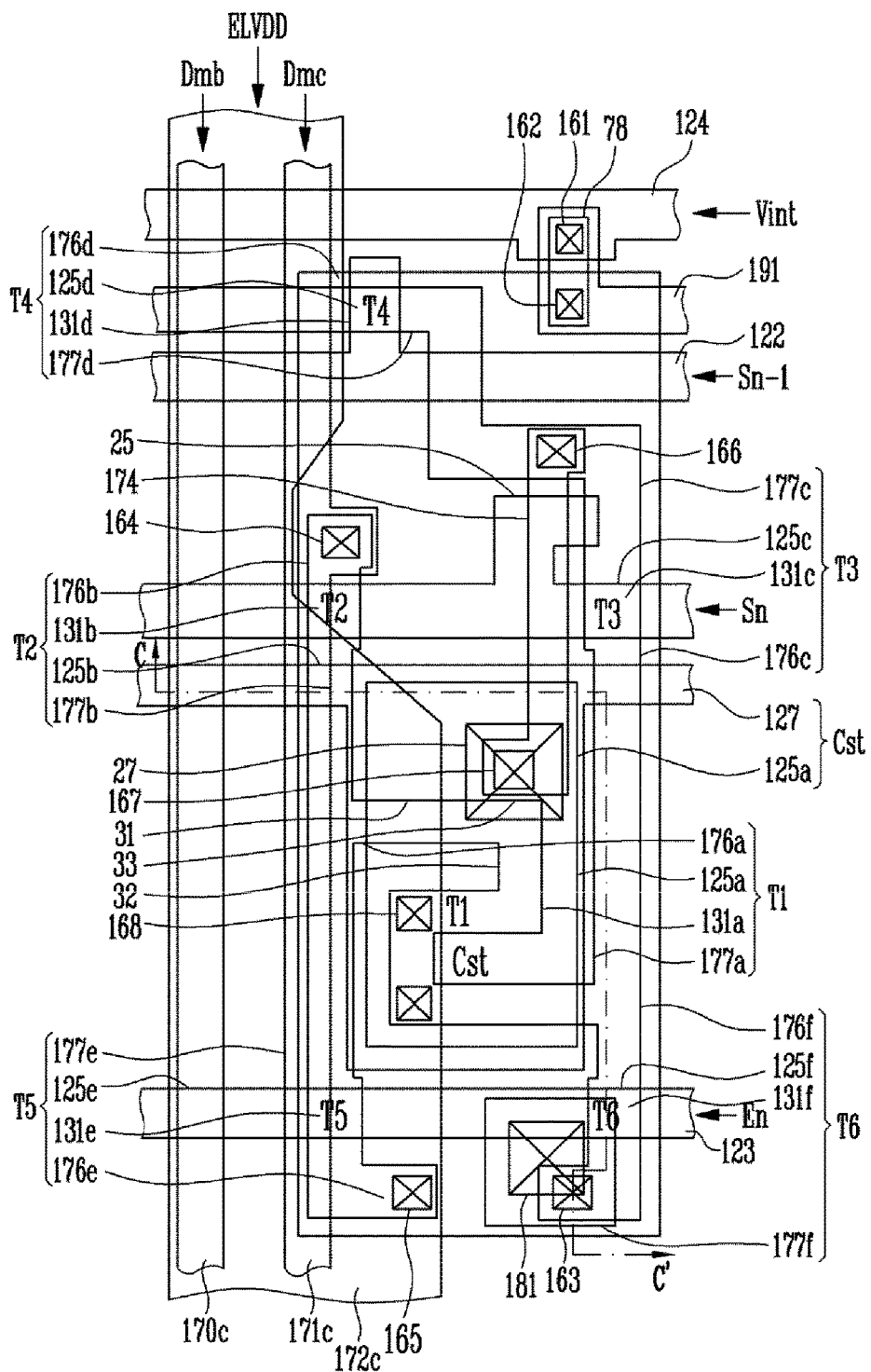
FIG. 6 is a detailed layout diagram of the region A of FIG. 2 according to another embodiment of the present inventive concept.
Figure 7:
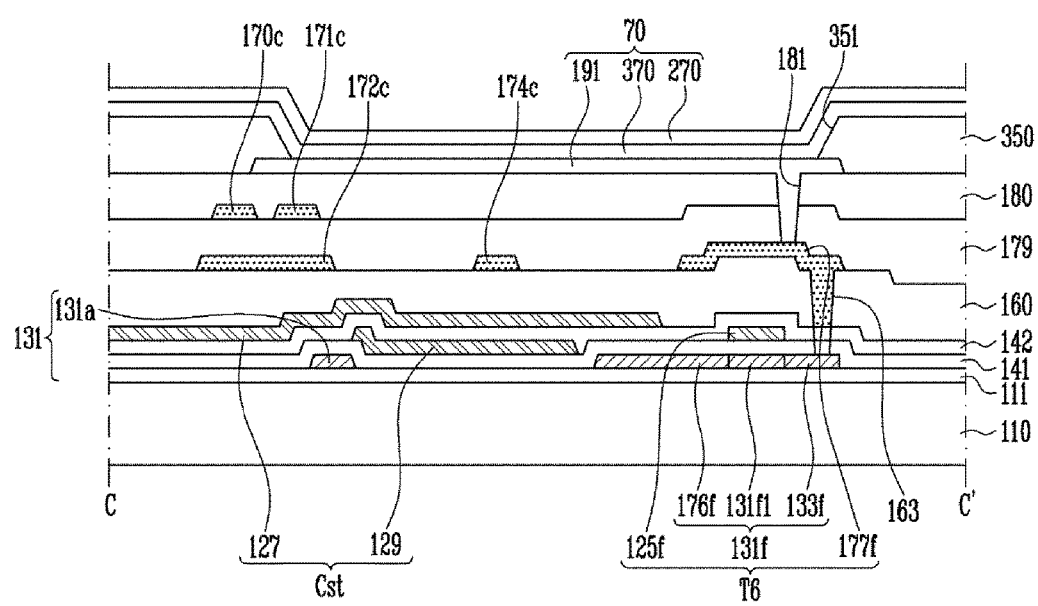
FIG. 7 is a cross-sectional view taken along the line C-C' of the layout of FIG. 6 according to an embodiment of the present inventive concept.

FIG. 6 is a detailed layout diagram of the region A of FIG. 2 according to another embodiment of the present inventive concept. FIG. 7 is a cross-sectional view taken along the line C-C' of the layout of FIG. 6 according to an embodiment of the present inventive concept.

Referring to FIGS. 6 and 7, the remaining elements excluding a first data line 170c, a second data line 171c, and a driving voltage line 172c are the same as those of the layout of FIGS. 4 and 5A. Therefore, description of the remaining elements will not be given.

Referring to FIGS. 6 and 7, the driving voltage line 172c is formed on the first interlayer insulating layer 160 and the first data line 170c and the second data line 171c are formed on the second interlayer insulating layer 179. The driving voltage line 172c may completely overlap the first data line 170c and the second data line 171c along a traverse direction in a plan view except a contact hose 164 which connects the switching TFT T2 and the second node disposed between the operation control TFT T5 and the emission control TFT T6. Therefore, the driving voltage line 172c may shield the first data line 170c and the second data line 171c against electrical interference generated by a conductive layers formed under the first interlayer insulating layer 160. In FIG. 7, it is illustrated that the storage capacitor Cst exists under the first interlayer insulating layer 160. Therefore, the driving voltage line 172c may shield the first data line 170c and the second data line 171c against electrical interference generated by the storage capacitor Cst that exists under the first interlayer insulating layer 160. In addition, referring to FIG. 6, the driving voltage line 172c is formed on the driving TFT T1, the switching TFT T2, the initializing TFT T4, and the operation control TFT T5. That is, at least a part of the driving voltage line 172c overlaps the driving TFT T1, the switching TFT T2, the initializing TFT T4, and the operation control TFT T5 in a plan view. On the other hand, at least a part of the second data line 171c also overlaps the driving TFT T1, the switching TFT T2, the initializing TFT T4, and the operation control TFT T5 in a plan view. Therefore, the driving voltage line 172c may prevent electrical signals respectively applied to the gate electrodes of the driving TFT T1, the switching TFT T2, the initializing TFT T4, and the operation control TFT T5 from being coupled to the first data line 170c and the second data line 171c. Therefore, coupling generated between the data lines and the driving transistors in the pixel circuit is reduced and interference of the data signals is prevented so that picture quality of the organic light emitting display device is improved.

On the other hand, in FIG. 7, it is illustrated that the first data line 170c and the second data line 171c are formed in the same layer. However, according to an embodiment, the first data line 170c and the second data line 171c of FIG. 7 may be formed on different layers. That is, the driving voltage line 172c is formed on the first interlayer insulating layer 160, the second data line 171c is formed on the second interlayer insulating layer 179 on the first interlayer insulating layer 160, and the first data line 170c may be formed on a third interlayer insulating layer (not shown) with an additional third interlayer insulating layer (not shown) interposed between the second interlayer insulating layer 179 and the protective layer 180. In this case, since coupling from the lower TFTs T1, T2, T4, and T5 is prevented by the driving voltage line 172c and the first data line 170c and the second data line 171c are formed on different layers, influence by coupling between the data lines may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present inventive concept as set forth in the following claims.

What is claimed is:

1. An organic light emitting display device comprising:
   a substrate;
   two pixel columns arranged on the substrate to be adjacent to each other;
   a first data line and a second data line that are provided between the two pixel columns;
   at least one scan line that intersects the first and second data lines; and
   first and second insulating layers sequentially laminated on the substrate,
   wherein at least a part of the pixels included in the two pixel columns is connected to one of the first data line and the second data line and the scan line, and
   wherein the first data line is formed on the first insulating layer and the second data line is formed on the second insulating layer, and the first data line and the second data line do not overlapping each other in a plan view.

2. The organic light emitting display device of claim 1, further comprising a driving voltage line provided between the two pixel columns,
   wherein the driving voltage line is formed on the first insulating layer.

3. The organic light emitting display device of claim 1, further comprising a driving voltage line provided between the two pixel columns,
   wherein the driving voltage line is formed on the second insulating layer.

4. The organic light emitting display device of claim 1, further comprising:
   a data driver configured to receive image data and generate data signals; and
   a switching unit configured to selectively supply the data signals received from the data driver to one of the first data line and the second data line.

5. The organic light emitting display device of claim 4, wherein the switching unit comprises a demultiplexer circuit.

6. An organic light emitting display device comprising:
   a substrate;
   two pixel columns arranged on the substrate to be adjacent to each other;
   a first data line and a second data line that are provided between the two pixel columns;
   a driving voltage line provided between the two pixel columns;
   at least one scan line that intersects the first data line, the second data line, and the driving voltage line; and
   first and second insulating layers sequentially laminated on the substrate,
   wherein at least a part of the pixels included in the two pixel columns is connected to one of the first data line and the second data line and the scan line and receives a driving voltage from the driving voltage line, and
   wherein the driving voltage line is formed on the first insulating layer and the first data line is formed on the second insulating layer.

7. The organic light emitting display device of claim 6, wherein the second data line is formed on the second insulating layer.

8. The organic light emitting display device of claim 7,
   wherein at least one driving transistor among pixels included in one of the two pixel columns is formed under the first insulating layer,
   wherein the driving voltage line overlaps the driving transistor in a plan view, and
   wherein the driving voltage line overlaps the first data line in a plan view.

9. The organic light emitting display device of claim 8, wherein the driving voltage line overlaps the second data line in a plan view.

10. The organic light emitting display device of claim 9, wherein the driving voltage line completely overlaps the first data line and the second data line along a traverse direction in a plan view.

11. The organic light emitting display device of claim 6, wherein the driving voltage line completely overlaps the first data line and the second data line along a traverse direction in a plan view.

12. The organic light emitting display device of claim 6, further comprising a third insulating layer laminated on the second insulating layer,
    wherein the second data line is formed on the third insulating layer.

13. The organic light emitting display device of claim 12,
    wherein at least one driving transistor among pixels included in one of the two pixel columns is formed under the first insulating layer,
    wherein the driving voltage line overlaps the driving transistor in a plan view, and
    wherein the driving voltage line overlaps the first data line in a plan view.

14. The organic light emitting display device of claim 13, wherein the driving voltage line overlaps the second data line in a plan view.

15. The organic light emitting display device of claim 14, wherein the driving voltage line completely overlaps the first data line and the second data line along a traverse direction in a plan view.

16. The organic light emitting display device of claim 12, wherein the driving voltage line completely overlaps the first data line and the second data line along a traverse direction in a plan view.

* * * * *